United States Patent
Yang et al.

(10) Patent No.: US 11,894,820 B2
(45) Date of Patent: Feb. 6, 2024

(54) TIME DIVISION INTERLEAVING BAND-PASS FILTER FOR USE IN VOICE ACTIVITY DETECTION

(71) Applicant: Reexen Technology Co., Ltd., Guang Dong (CN)

(72) Inventors: Xiaofeng Yang, Guangdong (CN); Minhao Yang, Zürich (CH); Hongjie Liu, Guang Dong (CN)

(73) Assignee: Reexen Technology Co., Ltd., Guang Dong (CN)

( * ) Notice: Subject to any disclaimer, the term of this patent is extended or adjusted under 35 U.S.C. 154(b) by 0 days.

(21) Appl. No.: 17/632,304

(22) PCT Filed: Mar. 4, 2021

(86) PCT No.: PCT/CN2021/079004
§ 371 (c)(1),
(2) Date: Feb. 2, 2022

(87) PCT Pub. No.: WO2021/203877
PCT Pub. Date: Oct. 14, 2021

(65) Prior Publication Data
US 2022/0294424 A1  Sep. 15, 2022

(30) Foreign Application Priority Data
Apr. 10, 2020 (CN) .......................... 202010278634.9

(51) Int. Cl.
*H03H 11/04* (2006.01)
*G10L 25/84* (2013.01)
(Continued)

(52) U.S. Cl.
CPC ............. *H03H 11/04* (2013.01); *G10L 25/84* (2013.01); *G10L 15/02* (2013.01); *H03K 3/0315* (2013.01)

(58) Field of Classification Search
None
See application file for complete search history.

(56) References Cited

U.S. PATENT DOCUMENTS

| 3,526,858 A | | 9/1970 | Heinlein et al. | |
| 5,187,445 A | * | 2/1993 | Jackson | H03H 11/04 330/109 |

(Continued)

FOREIGN PATENT DOCUMENTS

| CN | 1624763 | 6/2005 |
| CN | 107147408 | 9/2017 |

(Continued)

OTHER PUBLICATIONS

PCT International Search Report (with English translation) for corresponding Application No. PCT/CN2021/079004, dated Jun. 7, 2021, 6 pages.

(Continued)

*Primary Examiner* — Jeffery S Zweizig
(74) *Attorney, Agent, or Firm* — Dority & Manning, PA

(57) ABSTRACT

In one aspect, a time division interleaving band-pass filter can be used in voice activity detection, which operates at different central frequencies in respective intervals of a predetermined period of time. The band-pass filter circuitry includes multiple band-pass filtering channels sharing a common transistor circuit, bias circuit and current mirror circuit. The multiple band-pass filtering channels operate in a time division interleaving manner, which enables the sharing of the common set of band-pass filter circuitry components. Thus, the present invention allows a reduced chip area as the area does not increase proportionally with the number of filtering channels. The invention also mitigates the influence of transistor fabrication variations on the filter's central frequencies. Moreover, pulse durations $t_i$ are additionally introduced to the determination of the central (Continued)

frequencies, dispensing with the need for matching of current mirror circuits and transistors and resulting in higher accuracy of the band-pass filter's central frequencies.

9 Claims, 1 Drawing Sheet

(51) Int. Cl.
    *G10L 15/02* (2006.01)
    *H03K 3/03* (2006.01)

(56) References Cited

U.S. PATENT DOCUMENTS

| | | | |
|---|---|---|---|
| 9,374,063 | B1 | 6/2016 | Mak et al. |
| 9,584,164 | B1 | 2/2017 | Sheikh et al. |
| 2013/0322215 | A1 | 12/2013 | Du et al. |
| 2018/0175827 | A1 | 6/2018 | Chen et al. |

FOREIGN PATENT DOCUMENTS

| | | |
|---|---|---|
| CN | 108134592 | 6/2018 |
| CN | 111490750 | 8/2020 |
| TW | 201824747 | 7/2018 |

OTHER PUBLICATIONS

Croce et al., "A 760 nW, 180 nm CMOS Analog Voice Activity Detection System", 2020 IEEE Custom Integrated Circuits Conference (CICC), Mar. 22-25, 2020, Virtual, 4 pages.

Yang et al., "A 1μW Voice Activity Detector Using Analog Feature Extraction and Digital Deep Neural Network", 2018 IEEE International Solid-State Circuits Conference, Feb. 11-15, 2018, San Francisco, CA, 3 pages.

Yang et al., "Design of an Always-On Deep Neural Network-Based 1-μW Voice Activity Detector Aided With a Customized Software Model for Analog Feature Extraction", IEEE Journal of Solid-State Circuits, Jun. 2019, Vol, 54, No. 6, pp. 1764-1777.

Almutairi et al, "Fully-Differential Second-Order Tunable Bandstop Filter Based on Source Follower", Electronics Letters, vol. 55, No. 3, Feb. 7, 2019, pp. 122-124.

Supplementary European Search Report for corresponding Application No. EP 21784927, dated Sep. 20, 2022, 11 pages.

Yang et al, "Design of an Always-On Deep Neural Network-Based 1-μW Voice Activity Detector Aided with a Customized Software Model for Analog Feature Extraction", Journal of Solid-State Circuits, vol. 54, No. 6, Jun. 2019, 14 pages.

Chinese Search Report for Corresponding Chinese Application No. 202010278634.9, dated Feb. 11, 2023, 10 pages.

* cited by examiner

TIME DIVISION INTERLEAVING BAND-PASS FILTER FOR USE IN VOICE ACTIVITY DETECTION

CROSS-REFERENCE TO RELATED APPLICATIONS

The present application is a US national phase application of International Application No. PCT/CN2021/079004, filed Mar. 4, 2021, which, in turn, claims the right of priority to Chinese Application No. 202010278634.9, filed Apr. 10, 2020, the disclosures of both of which are hereby incorporated by reference herein in their entirety for all purposes.

TECHNICAL FIELD

The present invention relates to a band-pass filter and, more specifically, to a time division interleaving band-pass filter for use in voice activity detection.

BACKGROUND

In battery-powered internet of things (IoT) systems, less power consumption is a key factor that determines whether a terminal can be used for a longer time. A voice-enabled IoT system first discerns human voice from background noise by means of voice activity detection (VAD) and then activates other high power dissipating modules in the system, thus entailing a continuous standby voice system with low power consumption.

A task of VAD is to determine whether an input sound signal is human voice or background noise. Embedded voice recognition systems all employ pattern matching-based input signal preprocessing that involves feature extraction, a process for extracting, from the waveform of an input signal, one or more sets of parameters that describe the signal's features. Feature extraction is crucial to the success of VAD and often requires using a bank of band-pass filters whose central frequencies form a geometric sequence.

Therefore, traditional VAD is based on digital signal processing, in which an analog signal from a microphone sensor is first converted into its digital representation via a analog-to-digital converter (ADC), and digital band-pass filters are implemented using an algorithm. However, the digital implementation requires the use of the high power-consuming analog-to-digital converter (ADC), and the digital band-pass filters themselves consume much power. On the other hand, as an always-on detector, the VAD is required to provide sufficient classification accuracy with moderate power consumption.

Compared with the traditional VAD, the recent implementation based on analog techniques, as described in "Design of an Always-On Deep Neural Network-Based 1-μW Voice Activity Detector Aided With a Customized Software Model for Analog Feature Extraction", DOI: 10.1109/JSSC.2019.2894360 and "A 1 μW voice activity detector using analog feature extraction and digital deep neural network", DOI: 10.1109/ISSCC.2018.8310326, provides a high recognition rate with only 1 microwatt (μW) of consumed power and dispenses with the use of a "power hungry" ADC. This technique achieves low power consumption mainly by using 16 parallel analog band-pass filters to directly process the microphone sensor's output analog signal, and employs a super source follower (SSF) architecture-based band-pass filters bank whose central frequencies form a geometric sequence in the range of 100 Hz to 5000 Hz to obtain information about features of the input signal.

Although feature extraction through SSF architecture-based band-pass filtering can realize low power consuming VAD, it suffers from two deficiencies. One of the deficiencies is that each central frequency requires a separate band-pass filter circuit, leading to an increase in chip area and cost. The other deficiency is that, for the band-pass filters having multiple central frequencies within a specified frequency range, it is necessary for the individual central frequencies to be accurate to avoid aliasing. However, in the conventional work, the central frequency of each band-pass filter depends on the transconductance of a respective transistor and the capacitance of a respective metal capacitor therein. This limits the number of band-pass filters that can be implemented and the accuracy of their central frequencies because transconductance matching of the transistors requires accurate current mirror circuits and identical parameters of the transistors, in contrast to the fact that matching of transistor parameters and current mirror circuits varies considerably with manufacturing and operating environment variations.

Since voice-enabled IoT systems like Bluetooth headsets and smart watches are imposing strict requirements on chip area, it is important for VAD implementations to have a reduced chip area. Moreover, feature extraction based on analog circuitry is more susceptible to manufacturing and operating environment variations, when compared to that based on digital circuitry. This becomes worse when forming band-pass filtering channels with multiple different transistor circuits, leading to an insufficiently accurate central frequency of each band-pass filter and unsatisfactory feature extraction accuracy. Consequently, each chip will have a different recognition rate.

SUMMARY

In view of the above, in order to achieve a reduced circuit area for multiple band-pass filters and improved central frequency accuracy of the band-pass filters against manufacturing and operating environment variations, the present invention proposes a time-division band-pass filter incorporating analog band-pass filtering channels sharing a common transistor circuit, and the sharing is enabled by activating the channels having different central frequencies in respective different intervals of a given period of time.

In a first aspect, there is proposed a band-pass filter comprising a coupling capacitor, a first transistor, a first filtering channel array, a first current source and a second current source, the coupling capacitor connected to a gate of the first transistor, the first transistor comprising a source connected to an output of the first current source, the first transistor comprising a drain output connected to both the first filtering channel array and the second current source and grounded via the second current source. The band-pass filter further comprises a second transistor and a second filtering channel array, the second transistor comprising a gate input connected to the drain output of the first transistor. A source of the second transistor is grounded, and a drain thereof is connected to both the output of the first current source and an input of the second filtering channel array. Each of the first and second filtering channel arrays comprises multiple filtering channels each comprising a switch and a capacitor. The switch is connected to the capacitor, and the capacitor is grounded. The switch is controlled by a pulse signal of a phase $\varphi_i$, where i is an integer in the range of 0-N.

This design is based on a super source follower (SSF) architecture, which actually utilizes the shunt feedback between the first and second transistors to reduce the transistors' output impedances, thus improving their output voltage following performance. The first and second transistors are equivalent to a converter capable of controlling a current using a voltage, and the control capability is reflected by the transistors' transconductances. The converter converts voltage information into current information, which is then accumulated and stored on capacitors in filtering channels respectively in the first and second filtering channel arrays. It is particularly noted that each filtering channel in the first filtering channel array is paired with a respective filtering channel of the same phase $\varphi_i$ in the second filtering channel array to form a band-pass filtering channel. That is, the band-pass filter indeed includes only one common transistor circuit and a series of or multiple band-pass filtering channels having different central frequencies. This results in a reduced chip area. For example, in the phase $\varphi_0$ of the filter, the first transistor converts an input voltage signal into a corresponding current, which is then accumulated in the form of charge on the capacitor $C_{1,0}$ in an amount depending on the first transistor's transconductance $g_{m1}$ and a pulse duration to for the phase $\varphi_0$. The second transistor operates in the same manner as the first transistor. Within a given period of time T, the pulse durations for the phases $\varphi_0$, $\varphi_1$, $\varphi_2$, ..., $\varphi_N$ are $t_0$, $t_1$, $t_2$, ..., $t_N$, respectively, and variation of the central frequencies of the N+1 filtering channels contained in the first and second filtering channel arrays depends on the transconductances $g_{m1}$ and $g_{m2}$ of the first and second transistors and on the pulse durations $t_i$ of the phases $\varphi_i$ and the capacitances of the capacitors $C_{1,i}$ and $C_{2,i}$ in the channels, but not on the matching of transistor transconductances and current mirror circuits. Thus, the influence of manufacturing and operating environment variations on the accuracy of the central frequencies is mitigated.

The central frequency $f_i$ of the i-th band-pass filtering channel of the N+1 band-pass filtering channels that are consists of the first and second filtering channel arrays is given by:

$$f_i = \frac{1}{2*\pi} * \sqrt{\frac{g_{m1} * \frac{t_i}{T} * g_{m2} * \frac{t_i}{T}}{C_{1,i} * C_{2,i}}}$$

Additionally, in a predetermined period of time, the multiple band-pass filtering channels may operate in a time division interleaving manner where the band-pass filtering channels having different central frequencies occupy respective different intervals of the predetermined period of time, and for each band-pass filtering channel, the pulse duration $t_i$ of the phase $\varphi_i$ corresponds to a respective one of the intervals. In this way, the sharing of the common transistor circuit is allowed. In some embodiments, a ring oscillator consisting of three inverters may produce a clock signal with a period of $T_{vco}$ and provide it to a phase generator, which may then generate the pulse signals $\varphi_0$-$\varphi_N$ whose pulse durations are integral multiples of the ring oscillator's period.

Additionally, the band-pass filter may further comprise a bias circuit including a bias voltage terminal and at least one resistor. The bias circuit may be connected between the coupling capacitor and the first transistor, and an output of the bias circuit may be connected together with the coupling capacitor to the gate of the first transistor.

In particular, a bias voltage may be transmitted through the resistor in the bias circuit to the gate of the first transistor, thus biasing the first transistor to operate in saturation region so that a current from the drain output of the first transistor varies following variation of the input voltage.

Additionally, the predetermined period of time T may also be an integral multiple of the ring oscillator's period $T_{vco}$ and thus extremely matched with the pulse durations $t_i$ of the phases $\varphi_i$.

The present invention offers the following benefits.

1. The multiple band-pass filtering channels require only one transistor circuit of SSF architecture. Thus, it provides the multiple band-pass filtering channels with a reduced area, and the area does not increase proportionally with the number of band-pass filtering channel. As a result, for a particular frequency range, multiple band-pass filtering channels having different central frequencies may be provided in a given chip area. That is, a denser sequence of central frequencies can be achieved, which enables extraction of more feature information from a voice signal.

2. The pulse durations $t_i$ of the phases $\varphi_i$ are obtained by merging multiples of the period $T_{vco}$ of the ring oscillator, resulting in extremely high matching of $t_i$ and eliminating the influence of manufacturing and operating environment variations. As a result, matching of current mirror circuits and transistor parameters is dispensed with, and improved accuracy of the central frequencies is obtained.

3. The analog band-pass filter can directly process an analog signal without using a power hungry ADC, resulting in reduced power consumption.

LIST OF DENOTATIONS

| | |
|---|---|
| First Transistor | $M_1$ |
| Second Transistor | $M_2$ |
| First Current Source | $I_1$ |
| Second Current Source | $I_0$ |
| Coupling Capacitor | $C_b$ |
| Bias Voltage Terminal | $V_b$ |
| Bias Resistor | $R_b$ |
| Inverters | Inv1, Inv2, Inv3 |

DETAILED DESCRIPTION

The objects, principles, features and advantages of the present invention will become more apparent from the following detailed description of embodiments thereof, which is to be read in connection with the accompanying drawings. It will be appreciated that the particular embodiments disclosed herein are illustrative and not intended to limit the present invention, as also explained somewhere else herein.

It is particularly noted that, for the brevity of illustration, some connections or positional relationships that can be inferred from the text of this specification or the teachings disclosed herein are omitted in the figures, or not all positional changes are depicted. Such positional changes that are not clearly described or illustrated should not be considered as having not taken place. As collectively clarified here, this will not be explained separately in the following detailed description, for the sake of conciseness.

Voice activity detection (VAD) aims to identify and classify an input signal, and feature extraction is a key enabler for this, which is a process for extracting, from the waveform of an input signal, one or more sets of parameters that describe the signal's features. However, feature extraction needs to make trade-offs among low power consumption, a small footprint and a high recognition rate. When using a bank of band-pass filters whose central frequencies form a geometric sequence to extract features from the waveform of an input signal, the recognition rate depends on the accuracy of the band-pass filters' central frequencies.

Figure 1:
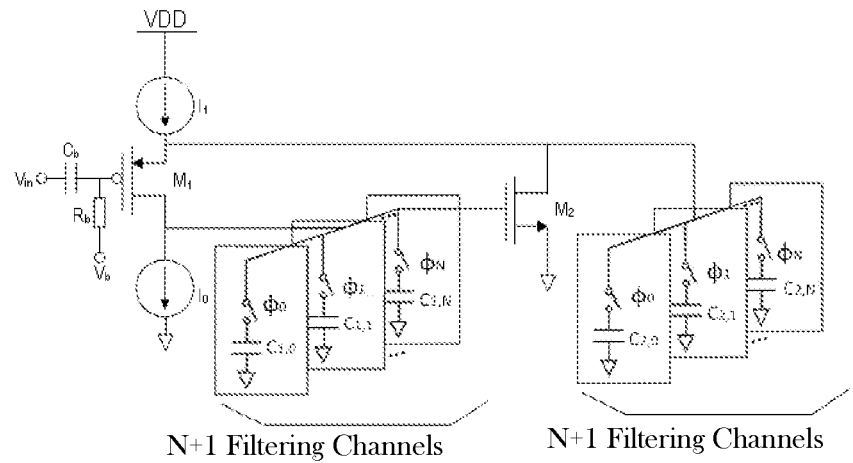
FIG. 1 is a schematic diagram illustrating an embodiment of the present invention.

FIG. 1 is a schematic illustration of a band-pass filter according to an embodiment of this application.

Referring to FIG. 1, the band-pass filter includes a coupling capacitor $C_b$, a first transistor $M_1$ and a first filtering channel array. The coupling capacitor is connected to a gate of the first transistor $M_1$, and a source of the first transistor $M_1$ is connected to an output of a first current source $IC_1$. A drain output of the first transistor $M_1$ is connected to both the first filtering channel array and a second current source $I_0$, and is grounded via the second current source $I_0$. The band-pass filter further includes a second transistor $M_2$ and a second filtering channel array. A gate of the second transistor is connected to the drain output of the first transistor $M_1$. A source of the second transistor is grounded, and a drain thereof is connected to both the output of the first current source $I_1$ and the second filtering channel array. It is noted that each of the first and second filtering channel arrays includes multiple filtering channels each including at least one switch, a capacitor and a pulse signal for controlling a phase $\varphi_i$ of the switch, where $i \in 0\text{-}N$. In this way, the drain output of the first transistor is connected to a top plate of the capacitor via the switch, and a bottom plate of the capacitor is grounded. In particular, in some embodiments, the band-pass filter may further include a bias circuit including a bias voltage terminal $V_b$ and at least one bias resistor $R_b$. The bias circuit may be connected between the coupling capacitor and the first transistor. An output of the bias circuit may be connected together with the coupling capacitor to the gate of the first transistor. In these embodiments, an AC component of an input signal introduced via $V_{in}$ is coupled to the gate of the first transistor $M_1$ by the coupling capacitor $C_b$, while a DC component thereof is isolated by the coupling capacitor $C_b$. A bias voltage introduced via the terminal $V_b$ is transmitted to the gate of the first transistor $M_1$ via the resistor $R_b$, biasing the first transistor $M_1$ to operate in saturation region. A current from the drain output of the first transistor $M_1$ varies with an input voltage. It will be appreciated that the input voltage refers to a voltage of the input signal with the DC component having been isolated.

It is to be understood that the first transistor $M_1$ is equivalent to a converter capable of controlling a current using a voltage, and the control capability is reflected by the transistor's transconductance, i.e., a ratio of a resulting change in its output current to a given change in the input voltage. The first transistor $M_1$ converts voltage information into current information, which is accumulated and stored in the form of charge in the capacitor of a corresponding filtering channel in the first filtering channel array. For example, in the phase $\varphi_0$ of the filter, the current information converted by the first transistor $M_1$ from the input voltage signal is accumulated on the capacitor $C_{1,0}$, and the amount of accumulated charge depends on the transconductance of the first transistor $M_1$ and a pulse duration to of the phase $\varphi_0$. Typically, the longer the time the switch is closed, the greater the amount of accumulated charge. Transconductances of the first and second transistors $M_1$, $M_2$ are denoted as $g_{m1}$ and $g_{m2}$, respectively. It is to be noted that in a given period of time T, the pulse durations of the phases $\varphi_0\text{-}\varphi N$ are denoted as $t_0\text{-}t_N$, e.g., the pulse duration of the phase $\varphi_N$ as $t_N$, and that of phase $\varphi_0$ as $t_0$. The second transistor $M_2$ operates in the same way as the first transistor $M_1$. Specifically, the voltage signal is output from the first transistor $M_1$ to the gate of the second transistor $M_2$ and is then converted by the second transistor $M_2$ into a current signal, which then passes through the switch in a corresponding filtering channel in the second filtering channel array and is accumulated and stored in the form of charge on the capacitor in the filtering channel.

It is to be understood that the transistor circuit in the super source follower (SSF) architecture of this application utilizes the shunt feedback between the first and second transistors $M_1$, $M_2$ to reduce the transistors' output impedances, thus improving their output voltage following performance and ensuring consistency of the output voltage. It is to be noted that the filtering channel of the phase $\varphi_i$ in the first filtering channel array corresponds to the filtering channel of the phase $\varphi_i$ in the second filtering channel array. That is, when the first filtering channel array includes N+1 filtering channels and the second filtering channel array includes N+1 filtering channels, N+1 band-pass filtering channels can be formed. For example, the filtering channel of the phase $\varphi_i$ in the first filtering channel array and the corresponding filtering channel of the same phase $\varphi_i$ in the second filtering channel array may constitute a band-pass filtering channel of the phase $\varphi_i$. In a given period of time T, as the filters in different band-pass filtering channels share the same transistor circuit, the variation of their central frequencies depends on the transconductances $g_{m1}$ and $g_{m2}$ of the first and second transistors and on the pulse durations $t_i$ of the phases $\varphi_i$ and the capacitances of the capacitors $C_{1,i}$ and $C_{2,i}$ in the channels. Thus, the central frequency $f_i$ of the i-th band-pass filter in the N+1 band-pass filtering channels is given by:

$$f_i = \frac{1}{2*\pi} * \sqrt{\frac{g_{m1}*\frac{t_i}{T}*g_{m2}*\frac{t_i}{T}}{C_{1,i}*C_{2,i}}}$$

It is to be understood that the N+1 band-pass filtering channels share the common transistor circuit, more specifically, the common coupling capacitor, bias circuit, first current source, second current source, first transistor and second transistor. Compared to the parallel band-pass filtering channels, each band-pass filtering channel reduces the use of a transistor circuit, a bias circuit and a current mirror circuit in SSF architecture, reducing the number of necessary transistor circuit components and thus leading to a reduced VAD chip area. Additionally, it is to be noted that, for the i-th band-pass filter, instead of depending on only the transconductances of the first and second transistors and the capacitances of the capacitors in the corresponding filtering channels of the first and second filtering channel arrays, its central frequency further depends on the pulse duration $t_i$ of the phase $\varphi_i$. The above central frequency expression may be considered as a corresponding modification, which can mitigate the influence of the transistor manufacturing and operating environment variations on the central frequency accuracy of the band-pass filters. Further, as the multiple band-pass filtering channels share a single transistor circuit, more filtering channels can be provided per unit chip area.

Figure 2:
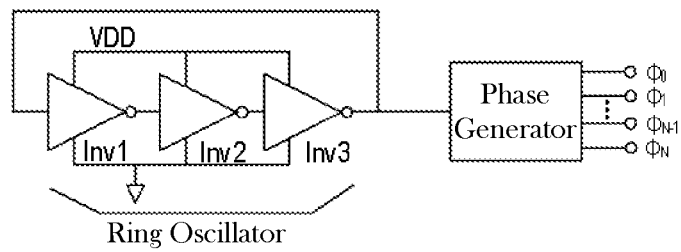
FIG. 2 is a schematic diagram illustrating phase generations for different filtering channels according to an embodiment of the present invention.

Further, in some embodiments, the N+1 band-pass filtering channels may operate in a time division interleaving manner where in a given period of time, each filtering channel in the first filtering channel array is paired with a corresponding filtering channel of the same phase $\varphi_i$ in the second filtering channel array to form a band-pass filtering channel. It would be appreciated that the first and second filtering channel arrays totally form N+1 band-pass filtering channels. These band-pass filtering channels occupy respective intervals in a predetermined period of time T, which correspond to the pulse durations $t_i$ of the respective phases $\varphi$ in the embodiment of FIG. 1. It is to be particularly noted that, for a high-frequency signal of tens of megahertz or higher, the time division interleaving filters typically require very low noise clock signals with a very high frequency (10 times that of the input signal or higher) to switch their switches, which consume much power. Moreover, transistors are not ideal switches and will introduce some error during every switching operation, and such errors are eventually manifested as unwanted extra charge on the capacitors. However, it is to be noted that most signals used in the human voice recognition system of this application have a frequency of several thousands of hertz or lower. Specifically, the band-pass filter of this application typically operates at a frequency of, e.g., 100-5000 Hz, so in practical applications, the time division interleaving band-pass filtering channels do not suffer from the above problem. In particular, in an embodiment as shown in FIG. 2, a ring oscillator consisting of three inverters (Inv1, Inv2, Inv3) produces a clock signal with a period of $T_{vco}$ and provides it to a phase generator, which then generates pulse signals $\varphi_0, \varphi_1, \varphi_2, \varphi_3, \ldots, \varphi_N$ having pulse durations $t_0, t_1, t_2, \ldots, t_N$ that are integral multiples of the ring oscillator's period. The predetermined period of time T is also an integral multiple of the ring oscillator's period. It is to be understood that the ring oscillator is not limited to consisting of three inverters and may consist of another odd number of inverters which can provide the same effect. Likewise, the phases $\varphi_0$-$\varphi_N$ are not limited to being produced by the phase generator, as long as their correspondence with $t_i$ is ensured.

Figure 3:
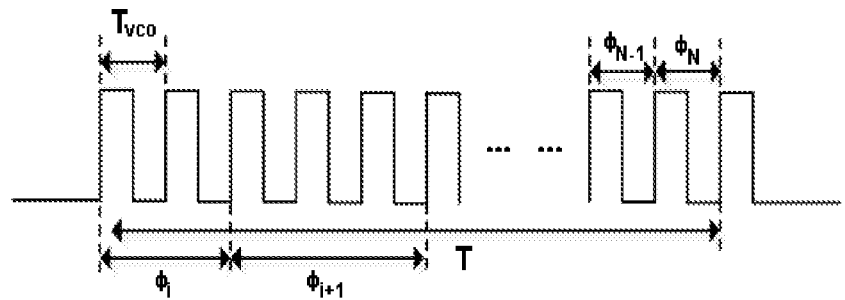
FIG. 3 is a schematic diagram illustrating the phase timing according to an embodiment of the present invention.

Further, referring to FIG. 3, the pulse duration $t_i$ of each phase $\varphi_i$ in the embodiment of FIG. 2 is achieved by merging a multiple of the period $T_{vco}$ of the ring oscillator. As an example, in order to meet the need for a band-pass filter with a sequence of different central frequencies, e.g., $f_i$-$f_n$, according to the equation as described above in connection with the embodiment of FIG. 1, at $\varphi_i$ of the filter, the band-pass filtering channel of this phase occupies the transistor circuit and operates at a central frequency $f_i$ in the interval $t_i$; in the next interval corresponding to the pulse duration $t_{i+1}$, the band-pass filtering channel of $\varphi_{i+1}$ in the filter occupies the transistor circuit and operates at a central frequency $f_{i+1}$; and so forth. In this way, the band-pass filtering channels with the central frequencies $f_i$-$f_n$ occupy the respective successive intervals. It is to be particularly noted that $t_i$ is achieved by merging a multiple of the period $T_{vco}$ of the ring oscillator, and the predetermined period of time T is also a multiple of the ring oscillator's period $T_{vco}$. This ensures extremely high matching of $t_i$, eliminates the influence of manufacturing and operating environment variations and dispenses with the need for matching of current mirror circuits and transistor parameters, thus obtaining more accurate central frequencies $f_i$. When used for voice feature extraction in voice recognition applications, the band-pass filtering channels having extremely accurate central frequencies of this application are helpful in improving accuracy of the voice recognition systems.

It is worth noting that the boundaries of the various blocks and modules included in the foregoing embodiments have been defined only based on their functional logic, and the present invention is not so limited, as alternate boundaries can be defined as long as the specified functions are appropriately performed. Also, specific names of the various functional components are intended to distinguish between these components rather than limit the scope of the present invention in any way.

The foregoing description presents merely preferred embodiments of the present invention and is not intended to limit the scope of the present invention in any way. Any and all changes, equivalent substitutions, modifications and the like made within the spirit and principles of the present invention are intended to be embraced in the scope thereof.

The invention claimed is:

1. A band-pass filter, comprising a coupling capacitor, a first transistor, a first filtering channel array, a first current source and a second current source, wherein the coupling capacitor is connected to a gate of the first transistor, a source of the first transistor is connected to an output of the first current source, a drain output of the first transistor is connected to both the first filtering channel array and the second current source and is grounded downstream the second current source; wherein the band-pass filter further comprises a second transistor and a second filtering channel array; the second transistor has a gate input connected to the drain output of the first transistor, a source that is grounded, and a drain connected to both the output of the first current source and the second filtering channel array; each of the first and second filtering channel arrays comprises a plurality of filtering channels each comprising a capacitor that is grounded and a switch connected to the capacitor, and the switch is controlled by a pulse signal of a phase $\varphi_i$, where i is an integer in a range of 0-N, and wherein each filtering channel in the first filtering channel array is paired with a corresponding filtering channel of a same phase ($\varphi_i$ in the second filtering channel array to form a band-pass filtering channel.

2. The band-pass filter of claim 1, further comprising a bias circuit comprising a bias voltage terminal and at least one resistor, wherein the bias circuit is disposed between the coupling capacitor and the first transistor, and has an output that is connected together with the coupling capacitor to the gate of the first transistor.

3. The band-pass filter of claim 2, wherein a bias voltage is transmitted through the resistor in the bias circuit to the gate of the first transistor, biasing the first transistor to operate in a saturation region.

4. The band-pass filter of claim 3, wherein the pulse signal of the phase $\varphi_i$ is generated by a phase generator to which a clock signal produced by a ring oscillator is input, the pulse signal having a pulse duration $t_i$ that is an integral multiple of a period of the ring oscillator.

5. The band-pass filter of claim 1, wherein the first filtering channel array and the second filtering channel array form a plurality of band-pass filtering channels.

6. The band-pass filter of claim 5, wherein the first transistor and the second transistor convert input voltage information into current information, and accumulate and store the current information in a form of charge on capacitors in the filtering channels respectively in the first filtering channel array and the second filtering channel array that correspond to the respective transistors.

7. The band-pass filter of claim 6, wherein in a predetermined period of time T, the plurality of band-pass filtering channels operate in a time division interleaving manner where the band-pass filtering channels of different phases $\varphi_i$ occupy respective different intervals in the predetermined period of time T.

8. The band-pass filter of claim 4, wherein:
the first filtering channel array and the second filtering channel array form a plurality of said band-pass filtering channels;
the first transistor and the second transistor convert input voltage information into current information, and accumulate and store the current information in a form of charge on capacitors in the filtering channels respectively in the first filtering channel array and the second filtering channel array that correspond to the respective transistors;
in a predetermined period of time T, the plurality of band-pass filtering channels operate in a time division interleaving manner where the band-pass filtering channels of different phases Qi occupy respective different intervals in the predetermined period of time T; and
the predetermined period of time T is also an integral multiple of the period of the ring oscillator.

9. The band-pass filter of claim 8, wherein the band-pass filtering channel of each phase $\varphi_i$ has a central frequency that is determined together by a transconductance of the first transistor, a transconductance of the second transistor, the predetermined period of time T, capacitances of the two filtering channels corresponding to the phase $\varphi_i$ and the pulse duration $t_i$ of the phase $\varphi_i$.

* * * * *